(12) United States Patent
Yoon et al.

(10) Patent No.: US 11,445,595 B2
(45) Date of Patent: Sep. 13, 2022

(54) AIRWAVES-PASSING-TYPE HEAT DISSIPATION SHEET AND COMMUNICATION MODULE COMPRISING SAME

(71) Applicant: LG INNOTEK CO., LTD., Seoul (KR)

(72) Inventors: Yeo Eun Yoon, Seoul (KR); Seok Bae, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/982,157

(22) PCT Filed: Mar. 26, 2019

(86) PCT No.: PCT/KR2019/003487
§ 371 (c)(1),
(2) Date: Sep. 18, 2020

(87) PCT Pub. No.: WO2019/190158
PCT Pub. Date: Oct. 3, 2019

(65) Prior Publication Data
US 2021/0029818 A1 Jan. 28, 2021

(30) Foreign Application Priority Data

Mar. 27, 2018 (KR) .................. 10-2018-0035223
Jan. 17, 2019 (KR) .................. 10-2019-0006181

(51) Int. Cl.
*H05K 9/00* (2006.01)
*C08K 3/38* (2006.01)
(Continued)

(52) U.S. Cl.
CPC ............. *H05K 1/0203* (2013.01); *C08K 3/38* (2013.01); *H05K 7/2039* (2013.01); *C08K 2003/385* (2013.01); *H05K 2201/10098* (2013.01)

(58) Field of Classification Search
None
See application file for complete search history.

(56) References Cited

U.S. PATENT DOCUMENTS 6,089,461 A 7/2000 Murohara
9,754,897 B2 * 9/2017 Lin .................. H01L 24/19
(Continued)

FOREIGN PATENT DOCUMENTS

JP 2010-245563 10/2010
KR 10-1999-0007145 1/1999
(Continued)

OTHER PUBLICATIONS

International Search Report dated Jun. 28, 2019 issued in Application No. PCT/KR2019/003487.

*Primary Examiner* — Courtney L Smith
(74) *Attorney, Agent, or Firm* — KED & Associates LLP

(57) ABSTRACT

The communication module according to one embodiment of the present invention comprises: a printed circuit board; an antenna unit and electronic components arranged on the printed circuit board; and a sheet layer arranged on the antenna unit and the electronic components, wherein the sheet layer comprises 15-35% of a polymer resin and 65-85 wt % of flat boron nitride, the flat boron nitride has an average particle size (D50) of 40 to 50 μm, a D10 of 10 to 25 μm, and a D90 of 75 to 85 μm, and the θ50 of the flat boron nitride is arranged to form an angle of 40° or less with horizontal components of the sheet layer.

20 Claims, 6 Drawing Sheets

(51) Int. Cl.
*H05K 1/02* (2006.01)
*H05K 7/20* (2006.01)

(56) References Cited

U.S. PATENT DOCUMENTS

| | | | |
|---|---|---|---|
| 10,772,245 B2* | 9/2020 | Craig | H01L 23/4006 |
| 2004/0022003 A1* | 2/2004 | Mazurkiewicz | H05K 3/284 |
| | | | 361/118 |
| 2011/0262728 A1* | 10/2011 | Izutani | C08L 63/00 |
| | | | 428/220 |
| 2012/0188730 A1 | 7/2012 | Miyata et al. | |
| 2016/0212841 A1* | 7/2016 | Hartmann | H01L 23/42 |
| 2016/0248278 A1* | 8/2016 | Ebe | H05K 7/2039 |
| 2018/0374776 A1* | 12/2018 | Liu | H01L 23/3737 |
| 2019/0246521 A1* | 8/2019 | Kumura | H01L 24/73 |

FOREIGN PATENT DOCUMENTS

| | | |
|---|---|---|
| KR | 10-1530624 | 6/2015 |
| KR | 10-2016-0078960 | 7/2016 |
| KR | 10-1756691 | 7/2017 |

\* cited by examiner

[FIG. 1]
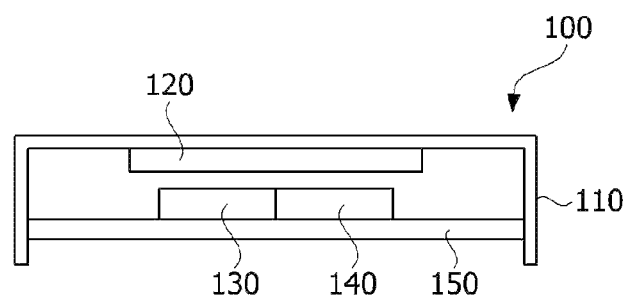
[FIG. 2]
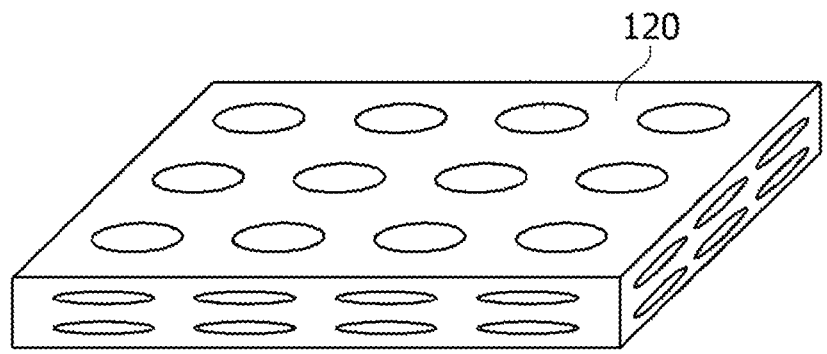
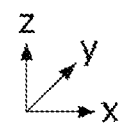

[FIG. 3]
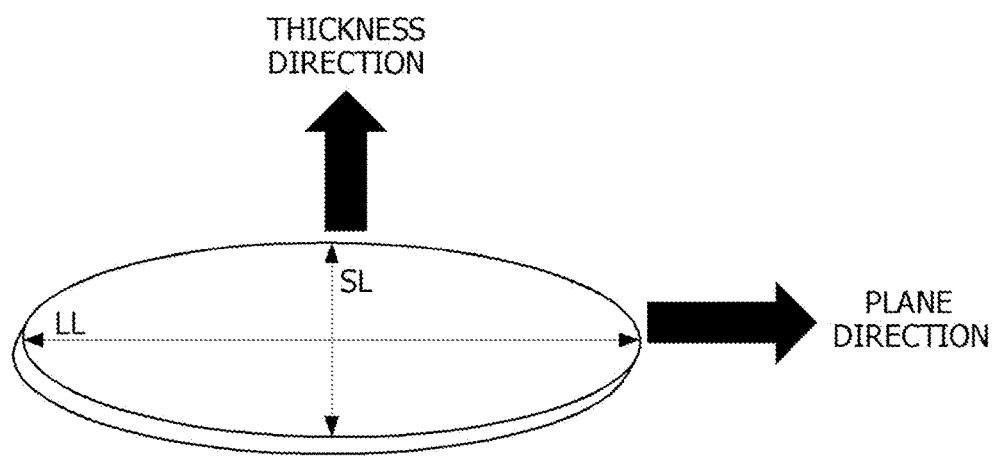
[FIG. 4]
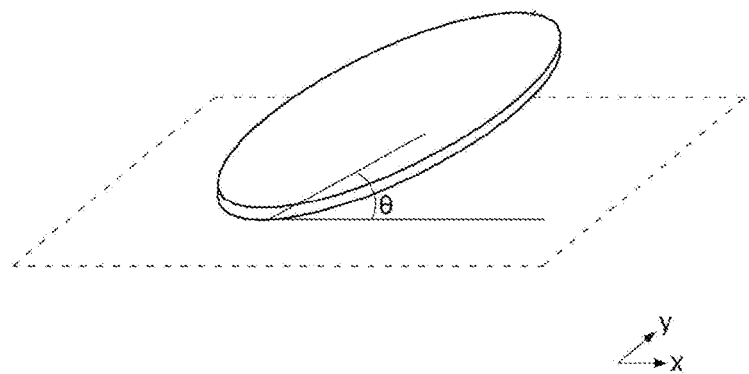

[FIG. 5A]
[FIG. 5B]
[FIG. 5C]
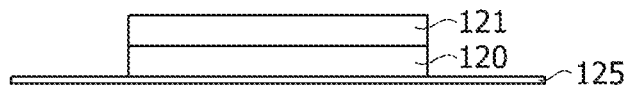
[FIG. 5D]
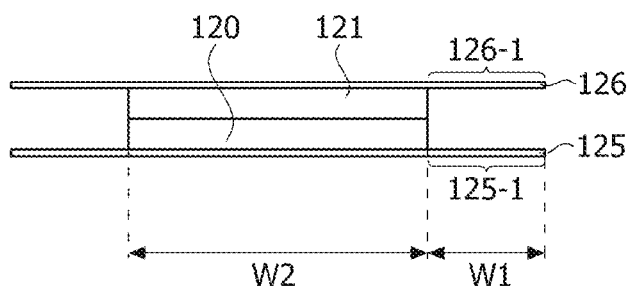
[FIG. 5E]
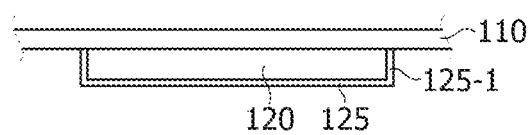
[FIG. 5F]
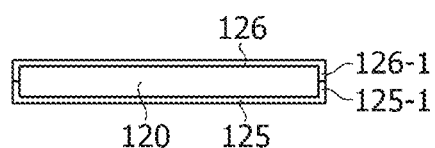
[FIG. 5G]
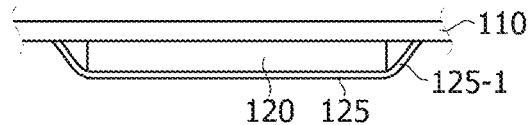
[FIG. 5H]
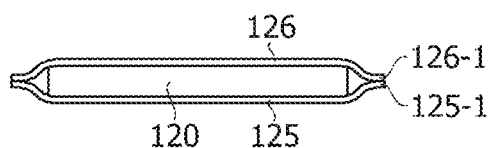

[FIG. 6A]
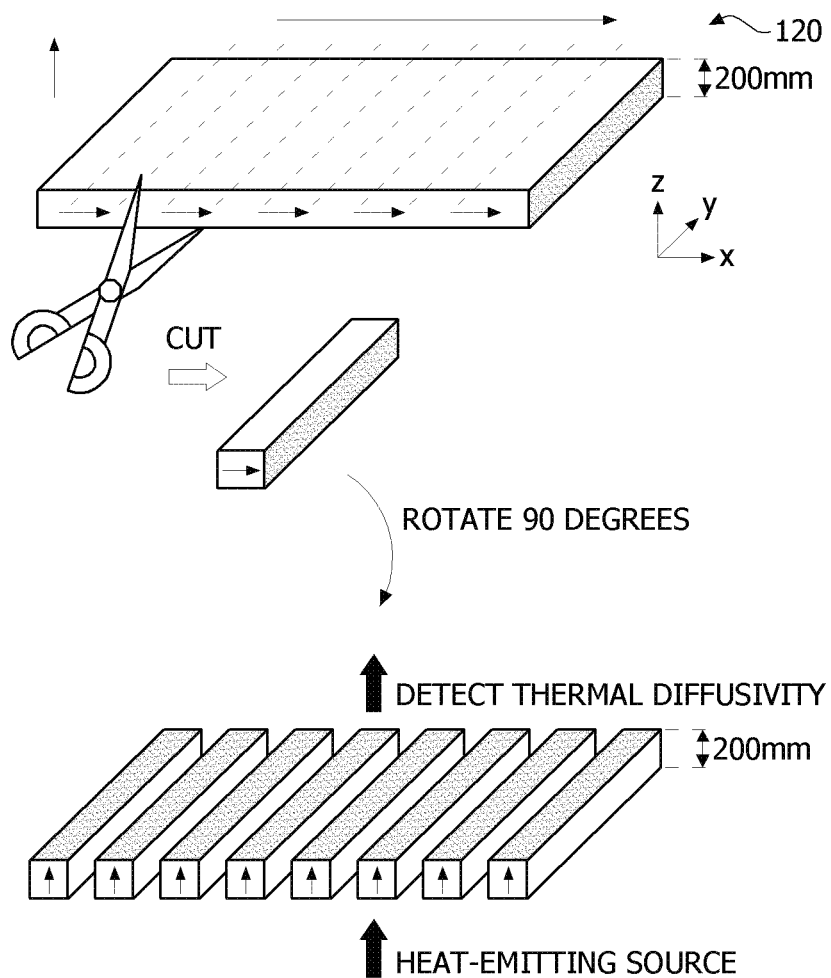
[FIG. 6B]
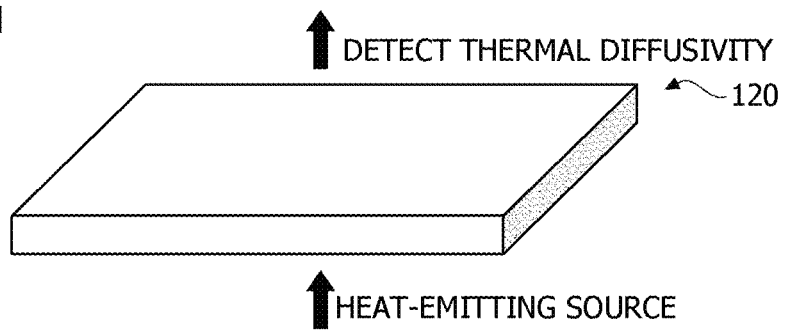

[FIG. 7]
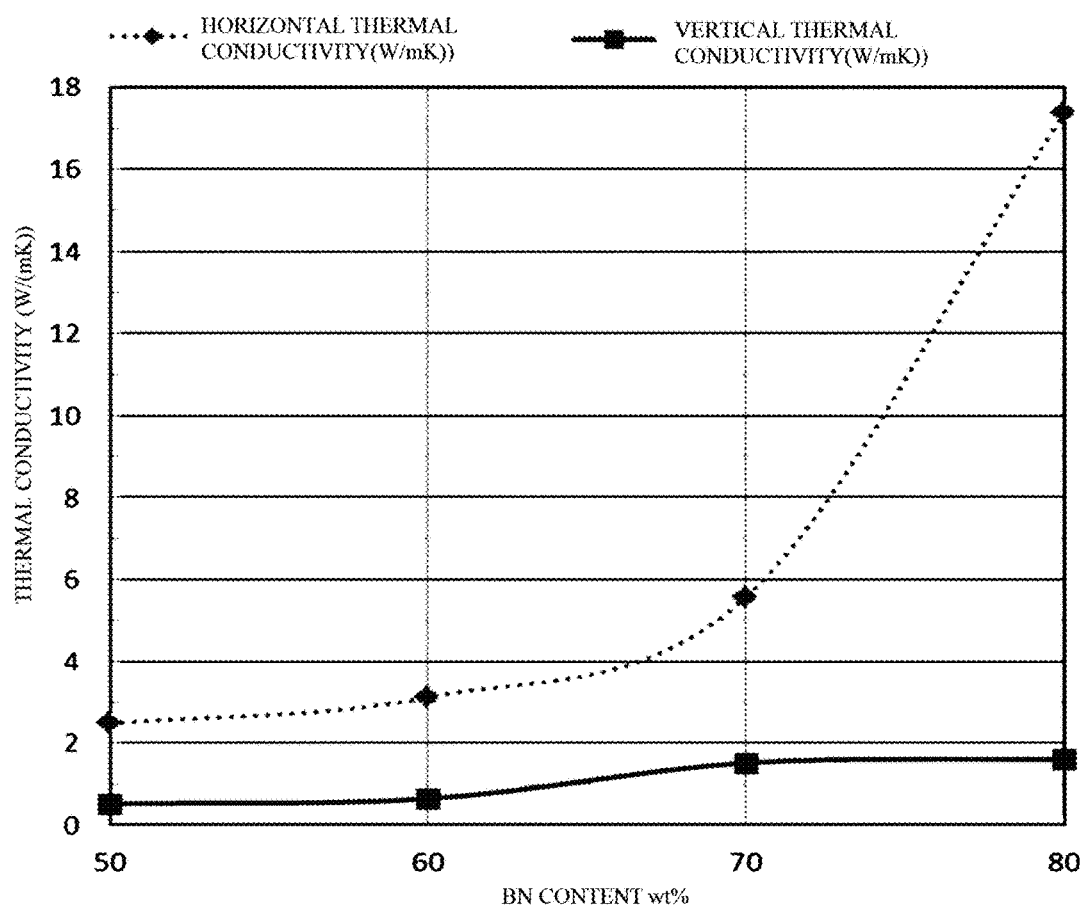

[FIG. 8]
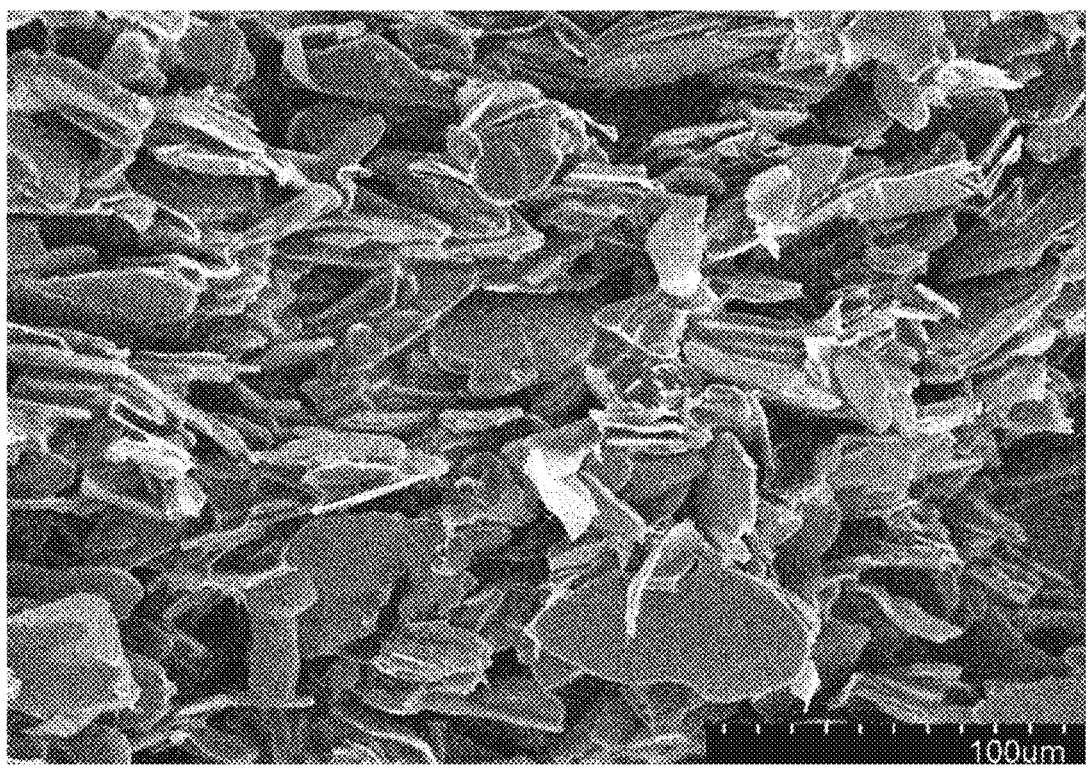

AIRWAVES-PASSING-TYPE HEAT DISSIPATION SHEET AND COMMUNICATION MODULE COMPRISING SAME

CROSS-REFERENCE TO RELATED PATENT APPLICATIONS

This application is a U.S. National Stage Application under 35 U.S.C. § 371 of PCT Application No. PCT/KR2019/003487, filed Mar. 26, 2019, which claims priority to Korean Patent Application Nos. 10-2018-0035223, filed Mar. 27, 2018 and 10-2019-0006181, filed Jan. 17, 2019, whose entire disclosures are hereby incorporated by reference.

TECHNICAL FIELD

The present invention relates to a radiowaves-passing-type heat dissipation sheet and a communication module including the same.

BACKGROUND ART

A portable terminal includes a processor unit and an antenna unit. A processor unit may be implemented in the form of a plurality of electronic components disposed on a printed circuit board (PCB), and some of the plurality of electronic components may emit a large amount of heat. Since heat emitted from an electronic component may affect the performance and durability of a portable terminal, a heat dissipation sheet capable of efficiently dissipating heat may be disposed under the electronic component. In general, a heat dissipation sheet may be a graphite sheet.

Meanwhile, along with the development of communication technology, a GHz frequency band is used and thus may be variously used for autonomous vehicles, drones, portable terminals, etc., which require a high transmission rate.

In a communication module using a GHz frequency band, an antenna unit may be disposed to be relatively close to an electronic component that emits heat in a processor unit compared to the conventional case. Accordingly, there is a need for the heat dissipation for an electronic component that emits heat and the transmission of an electromagnetic wave radiated from an antenna unit. A graphite sheet has excellent heat dissipation performance but absorbs or reflects electromagnetic waves. Accordingly, electromagnetic waves radiated from an antenna unit may be absorbed or reflected by a heat dissipating sheet, and thus communication performance may be lowered.

Thus, there is a need for a sheet having excellent heat dissipation performance and high electromagnetic wave transmission efficiency.

DISCLOSURE

Technical Problem

An object of the present invention is to provide a sheet having high heat dissipation performance and high electromagnetic wave transmission efficiency.

Technical Solution

A communication module according to an embodiment of the present invention includes a printed circuit board, an antenna unit and an electronic component disposed on the printed circuit board, and a sheet layer disposed on the antenna unit and the electronic component, wherein the sheet layer includes a polymer resin of 5 to 35 wt % and flat boron nitride of 65 to 95 wt %, the flat boron nitride has an average particle size D50 of 40 to 50 μm, D10 of 15 to 25 μm, and D90 of 75 to 85 μm, and the flat boron nitride has an angle θ50 of 40° or less with respect to a horizontal component of the sheet layer.

The angle θ50 of the flat boron nitride may be an angle of 20° or less with respect to the horizontal component of the sheet layer.

The sheet layer may have a thickness of 100 to 700 μm.

The polymer resin may include an epoxy compound modified with butadiene rubber.

The sheet layer may include a polymer resin of 15 to 30 wt % and flat boron nitride of 70 to 85 wt %.

The sheet layer may have a horizontal thermal conductivity of 5 W/mK or more, and the horizontal thermal conductivity may be three times or more than a vertical thermal conductivity of the sheet layer.

The horizontal thermal conductivity of the sheet layer may be greater than or equal to 15 W/mK and may be ten times or more than the vertical thermal conductivity, and the sheet layer may have a loss tangent Δ of 0.05% or less at 29 GHz and 1% or less at 39 GHz.

The electronic component and the antenna unit may be sequentially disposed on the printed circuit board, and the antenna unit and the electronic component may be sequentially disposed on the printed circuit board.

The electronic component may be disposed on the printed circuit board and on one side face of the antenna unit.

A separation distance between the electronic component and the antenna may be less than or equal to 5 mm.

The polymer resin may include an epoxy resin.

A sheet layer according to an embodiment of the present invention includes a polymer resin and flat boron nitride bonded to the polymer resin, wherein the content of the polymer resin is 5 to 35 wt %, the content of the flat boron nitride is 60 to 95 wt %, the flat boron nitride has an average particle size D50 of 40 to 50 μm, D10 of 15 to 25 μm, and D90 of 75 to 85 μm, and the flat boron nitride has an angle θ50 of 40° or less with respect to a horizontal component of the sheet layer.

The sheet layer may further include a protective layer disposed on one face or both faces of the sheet layer.

The protective layer may include an extension portion extending further than a side face of the sheet layer.

Advantageous Effects

According to an embodiment of the present invention, it is possible to obtain a sheet layer having excellent heat dissipation performance and high electromagnetic wave transmission efficiency. Thus, there may be no restrictions on the distance between an antenna module and a heat-emitting component in a communication device.

DESCRIPTION OF DRAWINGS

FIG. 1 is a cross-sectional view of a communication module according to an embodiment of the present invention.

FIG. 2 is a perspective view of a sheet layer according to an embodiment of the present invention.

FIG. 3 is an example of boron nitride included in a sheet layer according to an embodiment of the present invention.

FIG. 4 is an example illustrating the placement of boron nitride included in a sheet layer according to an embodiment of the present invention.

FIGS. 5A to 5H are cross-sectional views of a sheet layer according to an embodiment of the present invention.

FIGS. 6A and 6B are diagrams illustrating a method of measuring horizontal thermal conductivity and vertical thermal conductivity of sheet layers prepared according to comparative example 1, Comparative Example 2, Embodiment 1, and Embodiment 2.

FIG. 7 is a graph showing measurements of horizontal thermal conductivity and vertical thermal conductivity of sheet layers prepared according to Comparative Example 1, Comparative Example 2, Embodiment 1, and Embodiment 2.

FIG. 8 is a scanning electron microscope (SEM) image of a sheet layer prepared according to Embodiment 2.

MODE FOR CARRYING OUT THE INVENTION

While the invention is susceptible to various modifications and may have several embodiments, specific embodiments thereof are shown by way of example in the drawings and will herein be described. It should be understood, however, that there is no intent to limit the invention to the particular forms disclosed, but on the contrary, the invention is to cover all modifications, equivalents, and alternatives falling within the spirit and scope of the invention.

Although the terms "first," "second," etc. may be used herein to describe various elements, these elements should not be limited by these terms. These terms are only used to distinguish one element from another. For example, a first element may be called a second element, and a second element may also be called a first element without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an," and "one" are intended to include the plural forms as well, unless the context clearly indicates otherwise. It will be further understood that the terms "comprises," "comprising," "includes," and/or "including" when used herein, specify the presence of stated features, integers, steps, operations, elements, components, and/or combinations thereof but do not preclude the presence or addition of one or more other features, integers, steps, operations, elements, components, and/or combinations thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element such as a layer, film, region, or substrate is referred to as being "above" another element, it can be directly on the other element or intervening elements may also be present. On the contrary, when an element is referred to as being "directly on" another element, there is no intervening element.

Hereinafter, exemplary embodiments will be described in detail with reference to the accompanying drawings. The same reference numerals are given to the same or equivalent elements throughout the drawings and redundant descriptions thereof will be omitted.

FIG. 1 is a cross-sectional view of a communication module according to an embodiment of the present invention.

Referring to FIG. 1, a communication module 100 may include a cover layer 110, a sheet layer 120, an antenna unit 130, an electronic component 140, and a printed circuit board 150.

The cover layer 110 may be a cover case of a communication device. Here, the communication device may include various electronic devices with a communication function, for example, a portable terminal, a tablet PC, and the like, but the present invention is not limited thereto.

The sheet layer 120 may be disposed on the cover layer 110. The sheet layer 120 may be disposed in contact with one face of the cover layer 110. Here, the face of the cover layer 110 may be a face disposed in an inner space for accommodating the antenna unit 130, the electronic component 140, and the printed circuit board 150.

Meanwhile, the antenna unit 130 and the electronic component 140 may be disposed on the printed circuit board 150.

The cover layer 110 may be disposed to cover an upper face and a side face of the printed circuit board 150 on which the antenna unit 130 and the electronic component 140 are mounted. Also, the antenna unit 130 and the electronic component 140 mounted on the printed circuit board 150 may be disposed to face the sheet layer 120 disposed on one face of the cover layer 110. Here, the cover layer 110 is brought into contact with the side face of the printed circuit board 150, but the present invention is not limited thereto. The cover layer 110 may be spaced apart from the side face of the printed circuit board 150.

As shown in FIG. 1, the antenna unit 130 and the electronic component 140 may be adjacent to or in close contact with each other on the printed circuit board 150. Also, the sheet layer 120 may be disposed on the antenna unit 130 and the electronic component 140. Here, it is shown that the sheet layer 120 is disposed above and spaced apart from the antenna unit 130 and the electronic component 140, but the present invention is not limited thereto. The sheet layer 120 may be disposed above and brought into contact with the antenna unit 130 and the electronic component 140. Alternatively, although not shown, the sheet layer 120 may be disposed between the printed circuit board 150 and both of the antenna unit 130 and the electronic component 140.

Alternatively, although not shown, the electronic component 140 may be stacked on the printed circuit board 150, and the antenna unit 130 may be stacked on the electronic component 140. Alternatively, the antenna unit 130 may be stacked on the printed circuit board 150, and the electronic component 140 may be stacked on the antenna unit 130. Here, a pair of the electronic component 140 and the antenna unit 130 stacked on the electronic component and a pair of the antenna unit 130 and the electronic component 140 stacked on the antenna unit 130 may be collectively referred to as a stack of the antenna unit 130 and the electronic component 140. In this case, the sheet layer 120 may be disposed below the printed circuit board 150, between the printed circuit board 150 and the stack of the antenna unit 130 and the electronic component 140, or above the stack of the antenna unit 130 and the electronic component 140.

In this case, the antenna unit 130 and the electronic component 140 may be in close contact with each other or may be spaced 5 mm or less apart from each other.

Here, the electronic component 140 may be various kinds of electronic components that may be installed in the communication module 100, and some of the electronic components may be heat-emitting sources.

As shown in FIG. 1, when the distance between the antenna unit 130 and the electronic component 140 is small, the size of the communication device can be reduced. However, since a heat dissipation sheet for dissipating heat generated in the electronic component 140 may absorb or reflect electromagnetic waves radiated from the antenna unit 130, this can adversely affect the performance of the communication device.

Accordingly, an embodiment of the present invention is to arrange a sheet layer that transmits electromagnetic waves while having excellent heat dissipation performance.

FIG. 2 is a perspective view of a sheet layer according to an embodiment of the present invention, FIG. 3 is an example of boron nitride included in a sheet layer according to an embodiment of the present invention, and FIG. 4 is an example illustrating the placement of boron nitride included in a sheet layer according to an embodiment of the present invention.

Referring to FIG. 2, a sheet layer 120 according to an embodiment of the present invention may include a resin composition including a resin and an inorganic filler. Here, the sheet layer 120 may have a thickness of 100 μm to 700 μm. The heat dissipation performance may be degraded when the thickness of the sheet layer 120 is smaller than 100 μm, and the electromagnetic wave transmission performance may be degraded when the thickness of the sheet layer 120 is greater than 700 μm.

Here, the resin may include an epoxy compound and a curing agent. Herein, accordingly, the resin may be used interchangeably with an epoxy resin. In this case, when the epoxy compound has a volume proportion of 10, the curing agent may have a volume proportion of 1 to 10. Here, the epoxy component may include at least one of a crystalline epoxy compound, a non-crystalline epoxy compound, and a silicone epoxy compounds. The crystalline epoxy compound may include a mesogen structure. The mesogen is a basic unit of liquid crystal and includes a rigid structure. Also, the non-crystalline epoxy compound may be a typical non-crystalline epoxy compound having two or more epoxy groups therein and may be, for example, a glycidyl ether compound derived from Bisphenol A or Bisphenol F. Here, the curing agent may include at least one of an amine-based curing agent, a phenol-based curing agent, an acid anhydride-based curing agent, a polymercaptan-based curing agent, a polyaminoamide-based curing agent, an isocyanate-based curing agent, and a block isocyanate-based curing agent, and two or more types of such curing agents may be mixed and used.

According to an embodiment of the present invention, a polymer resin may further include butadiene rubber. Here, the butadiene rubber may be, for example, butadiene acrylonitrile rubber or carboxyl terminated butadiene acrylonitrile (CTBN) rubber. As described above, when the polymer resin includes butadiene rubber, the sheet layer 120 may be flexible and may be implemented with a thickness of 100 μm to 300 μm.

According to an embodiment of the present invention, the epoxy compound included in the polymer resin may be an epoxy compound modified with butadiene rubber. As described above, when the epoxy compound is an epoxy compound modified with butadiene rubber, the robustness and tensile strength of the sheet layer 120 may be improved. Here, the butadiene rubber may be, for example, butadiene acrylonitrile rubber or carboxyl terminated butadiene acrylonitrile (CTBN) rubber. The modification or alteration of the epoxy compound may be performed by reacting the epoxy compound and the butadiene rubber. For example, when the epoxy compound is reacted with the butadiene acrylonitrile rubber, the acrylonitrile group, which is a reactive group, may react with the epoxy group of the epoxy compound, thereby modifying or altering the epoxy compound. Alternatively, when the epoxy compound and the CTBN rubber are esterified, the carboxyl group of the CTBN rubber may react with the epoxy group of the epoxy compound, thereby modifying or altering the epoxy compound.

The inorganic filler may be boron nitride. Boron nitride has excellent thermal and electrical properties and is lightweight. Table 1 is a table of comparing the thermal properties, electrical properties, and specific gravity of boron nitride (BN), aluminum oxide ($Al_2O_3$), and silicon nitride ($Si_3N_4$).

TABLE 1

| | Properties | | BN | $Al_2O_3$ | $Si_3N_4$ |
|---|---|---|---|---|---|
| Thermal Properties | Thermal Conductivity | W(mK) | 40~80 | 26 | 33 |
| | Coefficient of Thermal Expansion | $10^{-6}$/K | 2.8 | 7.1 | 3.0 |
| Electric Properties | Resistivity | Ωcm | $>10^{14}$ | $>10^{14}$ | $>10^{14}$ |
| | Permittivity | — | 4.5 | 9.8 | 8.6 |
| Specific Gravity | | g/cm³ | 2.3 | 4.0 | 3.2 |

Referring to Table 1, boron nitride has higher thermal conductivity, lower permittivity, and lower specific gravity than aluminum oxide and silicon nitride. Thus, the sheet layer 120 according to an embodiment of the present invention may have excellent heat dissipation performance and high electromagnetic wave transmission efficiency when including boron nitride.

In this case, the boron nitride may be flat boron nitride. Here, the flat boron nitride may have an average particle size D50 of 40 to 50 μm, D10 of 15 to 25 μm, and D90 of 75 to 85 μm. D10 refers to a particle diameter corresponding to a passing percentage of 10% in particle size analysis data, D50 refers to a particle diameter corresponding to a passing percentage of 50% in particle size analysis data, and D90 refers to a particle diameter corresponding to a passing percentage of 90% in particle size analysis data. D50 and an average particle size may be used interchangeably. As shown in FIG. 3, flat boron nitride may have a ratio of a long length (LL) to a short length (SL) which is one or more in the plane direction, and the particle size of the flat boron nitride herein may mean the long length (LL) in the plane direction. Also, the length in the thickness direction may be significantly shorter than the length in the plane direction. For example, the length in the thickness direction is 0.5 times or less, preferably 0.1 times or less, and more preferably 0.01 times or less the short length SL in the plane direction.

Also, the flat boron nitride may have an angle θ50 of 40° or less, preferably 20° or less, and more preferably 10° or less with respect to the horizontal (X-Y direction) component of the sheet layer 120. Here, θ50 refers to an angle corresponding to when a cumulative percentage reaches 50% in a cumulative distribution of the horizontal angles of a total of particles, and θ50 may be used interchangeably with an average angle.

Accordingly, the horizontal (X-Y direction) thermal conductivity of the sheet layer 120 may be significantly higher than the vertical (Z direction) thermal conductivity of the sheet layer 120. When the horizontal thermal conductivity of the sheet layer 120 is higher than the vertical thermal conductivity of the sheet layer 120, heat generated in the electronic component 140 may be dissipated to the side face of the sheet layer 120, and thus it is possible to obtain high heat dissipation performance. When the horizontal thermal conductivity of the sheet layer 120 is higher than the vertical thermal conductivity of the sheet layer 120, in particular, heat conducted in the horizontal direction of the sheet layer 120 in the structure shown in FIG. 1 may be conducted in the plane direction of the cover layer 110, which has a larger area than the sheet layer 120, and thus it is possible to further increase heat dissipation performance.

Here, the surface of the flat boron nitride may be coated with a polymer resin. Any polymer resin may be used as long as the flat boron nitride can be combined with or coated with the polymer resin. The polymer resin may be selected from the group consisting of, for example, acrylic polymer resins, epoxy polymer resins, urethane polymer resins, polyamide polymer resins, polyethylene polymer resins, ethylene vinyl acetate copolymer (EVA) polymer resins, polyester polymer resins, and polyvinyl chloride (PVC) polymer resins. Also, the polymer resin may be a polymer resin having Monomer 1 below.

Monomer 1 is as follows.

[Monomer 1]

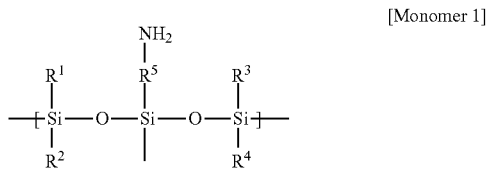

Here, one of $R^1$, $R^2$, $R^3$, and $R^4$ may be H, the others may be selected from the group consisting of $C_1$ to $C_3$ alkyls, $C_2$ and $C_3$ alkenes, and $C_2$ and $C_3$ alkynes, and R5 may be a divalent organic linker having 1 to 12 linear, branched, or cyclic carbon atoms.

In an embodiment, another one of $R^1$, $R^2$, $R^3$, and $R^4$ excluding H may be selected from $C_2$ and $C_3$ alkenes, and the others may be selected from $C_1$ to $C_3$ alkyls. For example, the polymer according to an embodiment may include Monomer 2 below.

[Monomer 2]

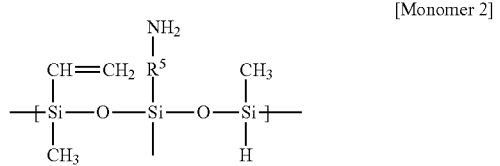

Alternatively, $R^1$, $R^2$, $R^3$, and $R^4$ excluding H may be selected from the group consisting of $C_1$ to $C_3$ alkyls, $C_2$ and $C_3$ alkenes, and $C_2$ and $C_3$ alkynes such that $R^1$, $R^2$, $R^3$, and $R^4$ are different from each other.

When the flat boron nitride is coated with a polymer based on Monomer 1 or Monomer 2, it becomes easy to form a functional group, and thus it is possible to increase affinity with a resin.

Meanwhile, a resin composition included in the sheet layer 120 according to an embodiment of the present invention may include a polymer resin of 5 to 35 wt % and flat boron nitride of 65 to 90 wt %.

In an embodiment, the resin composition included in the sheet layer 120 includes an epoxy resin of 15 to 35 wt %, preferably 15 to 30 wt %, and more preferably 15 to 25 wt % and flat boron nitride of 65 to 85 wt %, preferably 70 to 85 wt %, and more preferably 75 to 85 wt %.

When the flat boron nitride is below the lower limit of the above numerical range, the heat dissipation performance and the electromagnetic wave transmission efficiency may be low. When the flat boron nitride is above the upper limit of the above numerical range, that is, 85 wt %, cracking may occur during the preparation of the sheet layer because the bonding strength between the excess flat boron nitride and the epoxy resin is relatively weak. Thus, it may be difficult to prepare the sheet layer.

As another example, the resin composition included in the sheet layer 120 includes a polymer resin of 5 to 30 wt %, preferably 15 to 25 wt %, and more preferably 10 to 20 wt % and flat boron nitride of 70 to 95 wt %, preferably 75 to 85 wt %, and more preferably 80 to 90 wt %. In this case, the polymer resin may include an epoxy compound modified with butadiene rubber.

When the flat boron nitride is below the lower limit of the above numerical range, the heat dissipation performance and the electromagnetic wave transmission efficiency may be low. When the flat boron nitride is above the upper limit of the above numerical range, cracking may occur during the preparation of the sheet layer because the bonding strength between the excess flat boron nitride and the polymer resin is relatively weak. Thus, it may be difficult to prepare the sheet layer. As in the embodiment of the present invention, when the polymer resin includes an epoxy compound modified with butadiene rubber, the bonding strength with the flat boron nitride is improved and the flexibility is increased. Thus, the flat boron nitride can be added up to 95 wt %, and accordingly, it is possible to obtain higher thermal conductivity.

FIG. 5 is a cross-sectional view of a sheet layer according to an embodiment of the present invention.

Referring to FIG. 5A, a protective layer 125 may be additionally disposed on one face of the sheet layer 120.

Referring to FIG. 5B, a protective layer 125 and a protective layer 126 may be additionally disposed on two faces of the sheet layer 120. Here, the two faces of the sheet layer 120 may be one face and the opposite face of the sheet layer 120.

Referring to FIG. 5C, an additional sheet layer 121 may be disposed on the sheet layer 120. Also, a protective layer 125 may be additionally disposed on one face of a sheet layer stack including the sheet layer 120 and the sheet layer 121 stacked on the sheet layer 120.

Referring to FIG. 5D, an additional sheet layer 121 may be additionally disposed on the sheet layer 120. Also, a protective layer 125 and a protective layer 126 may be additionally disposed on both faces of a sheet layer stack including the sheet layer 120 and the sheet layer 121 stacked on the sheet layer 120.

In this case, each of the protective layers 125 and 126 may be a layer, sheet, or film containing a polymer resin. When a protective layer is disposed on one face or both faces of the sheet layer as described above, it is possible to prevent separation of the flat boron nitride included in the sheet layer, and also it is possible to minimize damage to the sheet layer due to external impact. In this case, when the protective layer 125 is disposed only on one face of the sheet layer 120 or the sheet stack as shown in FIG. 5A or 5C, a face on which the protective layer 125 is not disposed may be a face that is in contact with the cover layer 110 disclosed in FIG. 1.

In this case, the protective layers 125 and 126 may include no inorganic filler, and the thickness of one protective layer may be 0.001 to 0.1 times the thickness of one sheet layer. Accordingly, the protective layer can protect the sheet layer without degrading the heat dissipation performance or electromagnetic wave transmission performance of the sheet layer.

Although not shown, an adhesive layer may be additionally disposed between the sheet layer and the protective layer and between the sheet layers in FIGS. 5A to 5D.

Meanwhile, as shown in FIGS. 5A to 5D, the protective layers 125 and 126 may include extension portions 125-1 and 126-1 extending further than the side faces of the sheet layers 120 and 121. The width W1 of the extension portions 125-1 and 126-1 of the protective layers 125 and 126 may be 0.001 to 0.5 times, preferably 0.005 to 0.2 times, and more preferably 0.01 to 0.1 times the width W2 of the sheet layers 120 and 121. As described above, the extension portions 125-1 and 126-1 extending further than the side faces of the sheet layers 120 and 121 may protect the side faces of the sheet layers 120 and 121.

As shown in FIG. 5E to 5F, the extension portions 125-1 and 126-1 extending further than the side face of the sheet layer 120 may surround the side face of the sheet layer 120. In this case, as shown in FIGS. 5E and 5F, the extension portions 125-1 and 126-1 may surround, and be brought in contact with, the side surface of the sheet layer 120. Alternatively, as shown in FIGS. 5G and 5F, the extension portions 125-1 and 126-1 may surround, and be spaced apart from, the side surface of the sheet layer 120.

For convenience of description, only an example in which the extension portions 125-1 and 126-1 surround the side face of the single sheet layer 120 is shown, but the present invention is not limited thereto. The extension portions 125-1 and 126-1 may surround the side face of the stack of the sheet layers 120 and 121. The performance of a sheet layer according to an embodiment of the present invention will be described below in comparison with the performance of sheet layers according to comparative examples.

FIG. 6 is a diagram illustrating a method of measuring horizontal thermal conductivity and vertical thermal conductivity of sheet layers prepared according to Comparative Example 1, Comparative Example 2, and Embodiments 1 to 5, FIG. 7 is a graph showing measurements of horizontal thermal conductivity and vertical thermal conductivity of sheet layers prepared according to Comparative Example 1, Comparative Example 2, Embodiment 1, and Embodiment 2, and FIG. 8 is a scanning electron microscope (SEM) image of a sheet layer prepared according to Embodiment 2. Table 2 is a table showing measurements of the thermal properties of the sheet layers prepared according to Comparative Example 1, Comparative Example 2, and Embodiments 1 to 5, and Table 3 is a table showing measurements of the electric properties of a graphite sheet layer and the sheet layer prepared according to Embodiment 2.

The sheet layer according to Comparative Example 1 is a sheet layer that is prepared by compressing an epoxy resin composition including an epoxy resin of 50 wt % and flat boron nitride of 50 wt %, which has D50 of 45 μm, to a thickness of 200 μm.

The sheet layer according to Comparative Example 2 is a sheet layer that is prepared by pressing an epoxy resin composition including an epoxy resin of 40 wt % and flat boron nitride of 60 wt %, which has D50 of 45 μm, to a thickness of 200 μm.

The sheet layer according to Embodiment 1 is a sheet layer that is prepared by pressing an epoxy resin composition including an epoxy resin of 30 wt % and flat boron nitride of 70 wt %, which has D50 of 45 μm, to a thickness of 200 μm.

The sheet layer according to Embodiment 2 is a sheet layer that is prepared by pressing an epoxy resin composition including an epoxy resin of 20 wt % and flat boron nitride of 80 wt %, which has D50 of 45 μm, to a thickness of 200 μm.

The sheet layer according to Embodiment 3 is a sheet layer that is prepared by pressing an epoxy resin composition including an epoxy component of 20 wt %, which is modified with butadiene rubber, and flat boron nitride of 80 wt %, which has D50 of 45 μm, to a thickness of 500 μm.

The sheet layer according to Embodiment 4 is a sheet layer that is prepared by pressing an epoxy resin composition including an epoxy component of 10 wt %, which is modified with CTBN rubber, and flat boron nitride of 90 wt %, which has D50 of 45 μm, to a thickness of 200 μm.

The sheet layer according to Embodiment 5 is a sheet layer that is prepared by pressing an epoxy resin composition including an epoxy component of 20 wt %, which is modified with CTBN rubber, and flat boron nitride of 80 wt %, which has D50 of 45 μm, to a thickness of 200 μm.

Referring to FIG. 6A, the sheet layers prepared according to Comparative Example 1, Comparative Example 2, and Embodiments 1 to 5 were cut to a width of 200 μm, rotated by 90 degrees, and then placed so that the product of the total width and the total height is 1 cm×1 cm. A heat-emitting source was placed under the sheet layer, and thermal diffusivity over the sheet layer was measured. Then, horizontal thermal conductivity was detected therefrom.

Referring to FIG. 6B, a heat-emitting source was placed under the sheet layers prepared according to Comparative Example 1, Comparative Example 2, and Embodiments 1 to 5, and thermal diffusivity over the sheet layers was measured. Then, vertical thermal conductivity was detected therefrom.

When the thermal conductivity is detected in the method shown in FIGS. 6A and 6B, it is possible to accurately measure horizontal thermal conductivity as well as vertical thermal conductivity.

TABLE 2

| | Measurement Result | | | | | | |
|---|---|---|---|---|---|---|---|
| Experiment No. | Density Archimedes g/cm$^3$ | Specific Heat DSC J/(gK) | Vertical Thermal Diffusivity LFA mm$^2$/s | Horizontal Thermal Diffusivity LFA mm$^2$/s | Vertical Thermal Conductivity Density*Specific Heat*Thermal Diffusivity W/mK | Horizontal Thermal Conductivity Density*Specific Heat*Thermal Diffusivity W/mK | Flexibility Bent over 45 degrees ○/X |
| Comparative Example 1 | 1.362 | 1.219 | 0.322 | 1.499 | 0.53 | 2.49 | X |
| Comparative Example 2 | 1.434 | 1.169 | 0.380 | 1.868 | 0.65 | 3.13 | X |

TABLE 2-continued

| | | | | | Vertical Thermal Conductivity | Horizontal Thermal Conductivity | |
| | | | Vertical | Horizontal | Density*Specific | Density*Specific | Flexibility |
| | Density | Specific Heat | Thermal Diffusivity | Thermal Diffusivity | Heat*Thermal | Heat*Thermal | Bent over |
| Experiment | Archimedes | DSC | LFA | LFA | Diffusivity | Diffusivity | 45 degrees |
| No. | g/cm³ | J/(gK) | mm²/s | mm²/s | W/mK | W/mK | ○/X |
|---|---|---|---|---|---|---|---|
| Embodiment 1 | 1.522 | 1.137 | 0.878 | 3.227 | 1.52 | 5.58 | X |
| Embodiment 2 | 1.720 | 0.982 | 0.953 | 10.282 | 1.61 | 17.37 | X |
| Embodiment 3 | 1.425 | 1.137 | 0.906 | 4.243 | 1.47 | 6.87 | ○ |
| Embodiment 4 | 1.568 | 0.9844 | 0.932 | 15.203 | 1.44 | 23.47 | ○ |
| Embodiment 5 | 1.58 | 1.146 | 0.496 | 10.274 | 0.90 | 18.60 | ○ |

TABLE 3

| | Measurement Result | | | |
| | Loss Tangent Δ (%) | | Conductivity (S/m) | |
| | 28 GHz | 39 GHz | 28 GHz | 39 GHz |
|---|---|---|---|---|
| Embodiment 2 | 0.023 | 0.031 | 0.001 | 0.0019 |
| Graphite Sheet Layer | 0.057 (2.5 times↑) | 6.04 (195 times↑) | 0.005 (5 times↑) | 0.77 (405 times↑) |

Referring to Table 2 and Table 3, the horizontal thermal conductivity of the sheet layer according to Embodiments 1 to 5 may be greater than or equal to 5 W/mK and may be three times or more than the vertical thermal conductivity thereof. In particular, the horizontal thermal conductivity of the sheet layer according to Embodiment 2 is greater than or equal to 15 W/mK, the horizontal direction thermal conductivity is ten times or more than the vertical thermal conductivity thereof, and the loss tangent of the sheet layer is less than or equal to 0.05% at 29 GHz and is less than or equal to 1% at 39 GHz. It can be seen that the electromagnetic wave transmittance of the sheet layer is significantly higher than that of a graphite sheet layer. Also, it can be seen that the sheet layers according to embodiments 3 to 5 are flexible and thus can be applied to communication modules having various designs and that in particular, the sheet layers according to embodiments 4 and 5 is not only flexible but also has a horizontal thermal conductivity which is greater than or equal to 15 W/mk and which is ten times or more than the vertical thermal conductivity.

Accordingly, the sheet layer according to the embodiment of the present invention has excellent heat dissipation properties and excellent electromagnetic wave transmission performance and is flexible. Thus, even if a heat-emitting component is close to an antenna, the component may not affect the radiation performance of the antenna.

While the present invention has been described with reference to exemplary embodiments, it will be understood by those skilled in the art that variations and modifications of the invention may be made without departing from the spirit and scope of the invention as defined by the appended claims.

The invention claimed is:

1. A communication module comprising:
a printed circuit board;
an antenna unit and an electronic component disposed on the printed circuit board; and
a sheet layer disposed on the antenna unit and the electronic component,
wherein
the sheet layer includes a polymer resin of 5 to 35 wt % and flat boron nitride particles of 65 to 95 wt %,
the flat boron nitride particle have an average particle size of 40 to 50 μm, D10 of the flat boron nitride particles is 15 to 25 μm, and D90 of the flat boron nitride particles is 75 to 85 μm, and
the flat boron nitride particles have an angle θ50 of 40° or less with respect to a horizontal component of the sheet layer.

2. The communication module of claim 1, wherein the antenna unit and the electronic component disposed on the printed circuit board is disposed to face the sheet layer.

3. The communication module of claim 2, further comprising a cover layer disposed to cover an upper face and a side face of the printed circuit board on which the antenna unit and the electronic component are disposed,
wherein the sheet layer is disposed in contact with one face of the cover layer.

4. The communication module of claim 3, wherein the one face of the cover layer is a face disposed in an inner space for accommodating the antenna unit, the electronic component and the printed circuit board.

5. The communication module of claim 4, wherein an area of the one face of the cover layer is larger than an area of the sheet layer.

6. The communication module of claim 1, wherein the sheet layer is spaced apart from the antenna unit and the electronic component.

7. The communication module of claim 1, wherein the angle θ50 of the flat boron nitride particles is an angle of 20° or less with respect to the horizontal component of the sheet layer.

8. The communication module of claim 1, wherein the sheet layer has a thickness of 100 to 700 μm.

9. The communication module of claim 1, wherein the polymer resin includes an epoxy compound modified with butadiene rubber.

10. The communication module of claim 9, wherein the butadiene rubber includes butadiene acrylonitrile rubber or carboxyl terminated butadiene acrylonitrile (CTBN) rubber.

11. The communication module of claim 1, wherein the sheet layer has a horizontal thermal conductivity of 5 W/mK or more, and the horizontal thermal conductivity is three times or more than a vertical thermal conductivity of the sheet layer.

12. The communication module of claim 11, wherein the horizontal thermal conductivity of the sheet layer is greater than or equal to 15 W/mK and is ten times or more than the vertical thermal conductivity, and the sheet layer has a loss tangent Δ of 0.05% or less at 29 GHz and 1% or less at 39 GHz.

13. The communication module of claim 1, wherein the electronic component and the antenna unit are sequentially disposed on the printed circuit board, or the antenna unit and the electronic component are sequentially disposed on the printed circuit board.

14. The communication module of claim 1, wherein the electronic component is disposed on the printed circuit board and on one side face of the antenna unit.

15. The communication module of claim 14, wherein a separation distance between the electronic component and the antenna unit is less than or equal to 5 mm.

16. The communication module of claim 1, further comprising a protective layer disposed on one face or both faces of the sheet layer.

17. The communication module of claim 16, wherein the protective layer includes an extension portion extending further than a side face of the sheet layer.

18. The communication module of claim 16, wherein a thickness of the protective layer is 0.001 to 0.1 times a thickness of the sheet layer.

19. A sheet layer comprising:
a polymer resin; and
flat boron nitride particles bonded to the polymer resin, wherein
the content of the polymer resin is 5 to 35 wt %,
the content of the flat boron nitride particles is 60 to 95 wt %,
the flat boron nitride particles have an average particle size of 40 to 50 μm, D10 of the flat boron nitride particles is 15 to 25 μm, and D90 of the flat boron nitride particles is 75 to 85 μm, and
the flat boron nitride particles have an angle θ50 of 40° or less with respect to a horizontal component of the sheet layer.

20. The sheet layer of claim 19, wherein the polymer resin includes an epoxy compound modified with butadiene rubber.

* * * * *